United States Patent
Park et al.

(10) Patent No.: US 8,293,613 B2
(45) Date of Patent: Oct. 23, 2012

(54) GETTERING STRUCTURES AND METHODS AND THEIR APPLICATION

(75) Inventors: Young-Soo Park, Suji-gu (KR);
Young-Nam Kim, Yeongtong-gu (KR);
Young-Sam Lim, Wonmi-gu (KR);
Gi-Jung Kim, Giheung-gu (KR);
Pil-Kyu Kang, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/926,590

(22) Filed: Nov. 29, 2010

(65) Prior Publication Data

US 2011/0076838 A1    Mar. 31, 2011

Related U.S. Application Data

(62) Division of application No. 12/073,894, filed on Mar. 11, 2008, now abandoned.

(30) Foreign Application Priority Data

Mar. 12, 2007    (KR) ........................ 10-2007-0024094

(51) Int. Cl.
*H01L 21/331*    (2006.01)
(52) U.S. Cl. ........ 438/310; 438/143; 438/402; 438/476; 257/617; 257/E21.318; 257/E21.135
(58) Field of Classification Search ................. 438/476, 438/480, 310, 143, 402, 471; 257/617, E21.318, 257/E21.135, E29.107
See application file for complete search history.

(56) References Cited

U.S. PATENT DOCUMENTS

| | | | |
|---|---|---|---|
| 5,453,153 A | 9/1995 | Fan et al. | |
| 6,344,092 B1 | 2/2002 | Takizawa | |
| 7,326,597 B2 * | 2/2008 | Forbes et al. | 438/143 |
| 2004/0235264 A1 | 11/2004 | Forbes | |
| 2005/0104092 A1 | 5/2005 | Koester | |
| 2006/0175613 A1 | 8/2006 | Lee et al. | |
| 2006/0270086 A1 | 11/2006 | Rankin et al. | |
| 2008/0023770 A1 * | 1/2008 | Kim et al. | 257/365 |
| 2008/0213982 A1 * | 9/2008 | Park et al. | 438/480 |

FOREIGN PATENT DOCUMENTS

| | | |
|---|---|---|
| JP | 10-214843 | 8/1998 |
| JP | 11-026735 | 1/1999 |

(Continued)

OTHER PUBLICATIONS

Koji Sumino "Basic Aspects of Impurity Gettering," Microelectronic Engineering 66 (2003) pp. 268-280.

*Primary Examiner* — Olik Chaudhuri
*Assistant Examiner* — Wilner Jean Baptiste
(74) *Attorney, Agent, or Firm* — Harness, Dickey & Pierce, P.L.C.

(57) ABSTRACT

An embodiment of a semiconductor device includes a semiconductor substrate, a first insulating layer formed over the semiconductor substrate, and a first semiconductor layer formed over the first insulation layer. At least one gettering region is formed in at least one of the first insulating layer and the first semiconductor layer. The gettering region includes a plurality of gettering sites, and at least one gettering site includes one of a precipitate, a dispersoid, an interface with the dispersoid, a stacking fault and a dislocation.

14 Claims, 23 Drawing Sheets

FOREIGN PATENT DOCUMENTS

| | | |
|---|---|---|
| JP | 11-067779 | 3/1999 |
| JP | 11-297976 | 10/1999 |
| JP | 2002-164520 | 6/2002 |
| JP | 2006-005341 | 1/2006 |
| JP | 2006-216934 | 8/2006 |
| JP | 2006-245316 | 9/2006 |
| KR | 10-0536930 | 12/2005 |
| KR | 10-2006-0099694 | 9/2006 |
| KR | 10-0632463 | 9/2006 |

* cited by examiner

GETTERING STRUCTURES AND METHODS AND THEIR APPLICATION

CROSS REFERENCE TO RELATED APPLICATION

This application is a divisional of and claims priority under 35 U.S.C. §120 and 121 to U.S. application Ser. No. 12/073,894, filed Mar. 11, 2008, which claims priority under 35 U.S.C. §119 to Korean Patent Application No. KR 10-2007-0024094, filed on Mar. 12, 2007, the entire contents each of which are hereby incorporated herein by reference.

BACKGROUND

Impurity gettering techniques are widely used in the production of modern semiconductor devices to remove undesirable contaminants from active regions of the device. Gettering involves the transportation of the impurities to sink regions in the substrate that are located away from the active regions.

Structural defects in the crystalline structure of the substrate are commonly used as sinks for the gettering of contaminants. Gettering of this type is well-developed for silicon substrates, and includes two categories of gettering: intrinsic and extrinsic.

In intrinsic gettering, a region of the substrate containing precipitates such as $SiO_2$ act as an effective sink region. Such a region contains many types of structural defects such as punched out dislocations and extrinsic stacking faults in addition to $SiO_2$ precipitates. Generally, different types of structural defects have their own characteristics in the gettering of impurities In extrinsic gettering, structural defects are created using external sources. For example, a common extrinsic gettering technique is to grind the back surface of the silicon wafer.

SUMMARY

The present invention relates to the creation of gettering regions in new and unique ways. The flexibility provided by these techniques allows for extension of gettering techniques beyond simple two-dimension substrate based architectures. Namely, these techniques find applicability to three dimensional architectures such as stacked semiconductor packages and/or devices.

For example, an embodiment of a semiconductor device includes a semiconductor substrate, a first insulating layer formed over the semiconductor substrate, and a first semiconductor layer formed over the first insulation layer. At least one gettering region is formed in at least one of the first insulating layer and the first semiconductor layer. The gettering region includes a plurality of gettering sites, and at least one gettering site includes one of a precipitate, a dispersoid, an interface with the dispersoid, a stacking fault and a dislocation.

The gettering regions may have at least one of the following positions within the first insulating layer: extending from an upper surface of the first insulating layer to a lower surface of the first insulation layer, extending from below an upper surface of the first insulating layer to a lower surface of the first insulating layer, extending from an upper surface of the first insulating layer to above a lower surface of the first insulation layer, and extending from below an upper surface of the first insulating layer to above a lower surface of the first insulating layer.

In one embodiment, the device includes at least one semiconductor pattern formed in the first insulating layer, and the gettering region is at least a portion of the semiconductor pattern.

The present invention also relates to methods of forming a semiconductor structure.

In one embodiment, the method includes forming a first insulating layer over a semiconductor substrate, and forming a gettering region in a portion of the first insulating layer. The gettering region includes gettering sites.

In another embodiment, the method includes forming a first insulating layer over a semiconductor substrate, and forming at least one gettering region on the first insulation layer. The gettering region includes gettering sites. A second insulating layer is formed over the first insulating layer.

A still further embodiment of the method includes forming a gettering region layer over a first semiconductor substrate, and patterning the first semiconductor substrate and the gettering region layer to form at least one semiconductor substrate projection having a gettering region formed there over. The first semiconductor substrate is positioned near a second semiconductor substrate such that the semiconductor substrate projection projects towards a first insulation layer on the second semiconductor substrate. A first semiconductor layer is formed over the first insulating layer such that the first semiconductor layer covers the gettering region, and the first semiconductor substrate is removed such that at least the gettering region remains in the first semiconductor layer.

Another embodiment of a method of forming a semiconductor structure includes positioning a first semiconductor substrate near a second semiconductor substrate. The second semiconductor substrate has a first insulating layer formed there over and at least one gettering region formed in the first insulating layer. The first semiconductor substrate has projections, and the first semiconductor substrate is positioned such that the projections project towards the first insulating layer. A first semiconductor layer is formed over the first insulating layer such that the first semiconductor layer covers a portion of the projections. The first semiconductor substrate is removed such that at least portions of the projections covered by the first semiconductor layer remain in the first semiconductor layer.

Yet another embodiment includes providing a semiconductor substrate having a first insulating layer formed there over and at least one gettering region formed in the first insulating layer. A carrier solution having a solvent and semiconductor crystal patterns is coated over the first insulating layer. The solvent is removed to leave the semiconductor crystal patterns, and a semiconductor layer is grown on the first insulating layer using the semiconductor crystal patterns as a seed layer.

An additional embodiment includes providing a semiconductor substrate having a first insulating layer formed there over and at least one gettering region formed in the first insulating layer. At least one semiconductor plug is formed in the first insulation layer, and a semiconductor layer is formed on the first insulating layer using the semiconductor plug as a seed layer.

BRIEF DESCRIPTION OF THE DRAWINGS

The above and other features and advantages of the present invention will become more apparent to those of ordinary skill in the art by describing in detail example embodiments thereof with reference to the attached drawings in which.

DETAILED DESCRIPTION OF EXAMPLE EMBODIMENTS

Figure 1:
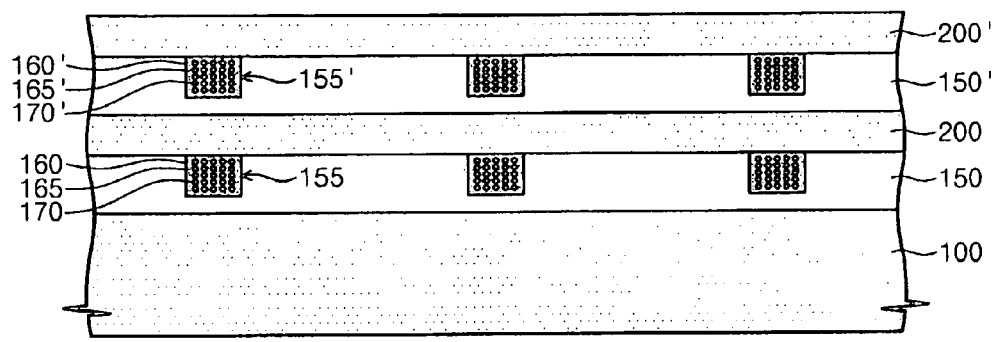
FIG. 1 illustrates a gettering structure according to a first embodiment of the present invention.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Initially, various gettering structures according to embodiments of the present invention will be described. This will be followed by a description of different methods for forming one or more of the gettering structures.

FIG. 1 illustrates a gettering structure according to a first embodiment of the present invention. As shown, the structure includes a first interlayer insulating layer 150 formed on a semiconductor substrate 100. Cavities 155 are formed in the first interlayer insulating layer 150, and the cavities are filled with semiconductor material to create semiconductor patterns 160. The semiconductor material may be amorphous silicon, single crystal silicon, poly crystal silicon, poly crystal silicon having nano scale grains, etc. and any combination of the above.

The semiconductor patterns 160 include gettering sites 170 dispersed throughout the semiconductor patterns 160 creating gettering region 165 extending from an upper surface of the first interlayer insulating layer 150 to above a lower surface of the first interlayer insulating layer 150. The gettering sites 170 may be a dispersoid in the semiconductor material, an interface with the dispersoid, precipitates, and/or structural imperfections. The dispersoid may be nitrogen, carbon and/or oxygen. The precipitates may be $SiO_2$, $SiN_2$, SiC, SiON, etc. The structural imperfections may be stacking faults and/or dislocations. For example, the stacking faults and/or dislocations may be created by implantation of H, He, Ar, Si, Ge, Ne, etc.

A first upper semiconductor layer 200 is formed over the first interlayer insulation layer 150. A second interlayer insulation layer 150' is formed over the first upper semiconductor layer 200. Cavities 155' are formed in the second interlayer insulating layer 150', and the cavities are filled with semiconductor material to create semiconductor patterns 160'. The semiconductor material may be amorphous silicon, single crystal silicon, poly crystal silicon, poly crystal silicon having nano scale grains, etc. and any combination of the above.

The semiconductor patterns 160' include gettering sites 170' creating a gettering region 165' extending from an upper surface of the second interlayer insulating layer 150' to above a lower surface of the second interlayer insulating layer 150'. The gettering sites 170' may be a dispersoid in the semiconductor material, an interface with the dispersoid, precipitates, and/or structural imperfections. The dispersoid may be nitrogen, carbon and/or oxygen. The precipitates may be $SiO_2$, $SiN_2$, SiC, SiON, etc. The structural imperfections may be stacking faults and/or dislocations. For example, the stacking faults and/or dislocations may be created by implantation of H, He, Ar, Si, Ge, Ne, etc.

A second upper semiconductor layer 200' may be formed over the second interlayer insulation layer 150'. It will be appreciated that this structural pattern may continue to be repeated.

Figure 2:
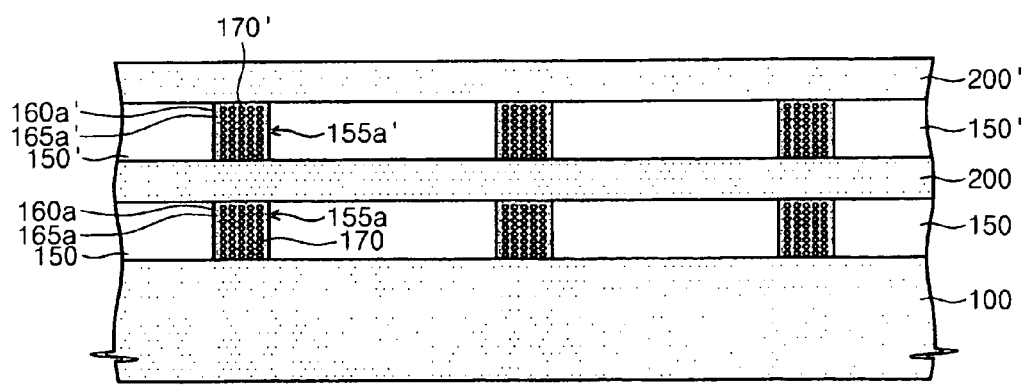
FIG. 2 illustrates a gettering structure according to a second embodiment of the present invention.

FIG. 2 illustrates a gettering structure according to a second embodiment of the present invention. This embodiment is the same as the embodiment of FIG. 1, except that the cavities 155 and 155' have been replaced by through holes 155a and 155a'. As such, the semiconductor material filling the through holes 155a may contact the semiconductor substrate 100 and the first upper semiconductor layer 200, while the semiconductor material filling the through holes 155a' may contact the first upper semiconductor layer 200 and the second upper semiconductor layer 200'. As shown, the through holes 155a and 155a' are completely filled with semiconductor material to create respective semiconductor patterns 160a and 160a' having respective gettering sites 170a and 170a' forming respective gettering regions 165a and 165a'. The gettering region 165a extends from an upper surface of the first interlayer insulating layer 150 to a bottom surface of the first interlayer insulating layer 150. The gettering region 165a' extends from an upper surface of the second interlayer insulating layer 150' to a bottom surface of the second interlayer insulating layer 150'.

Figure 3:
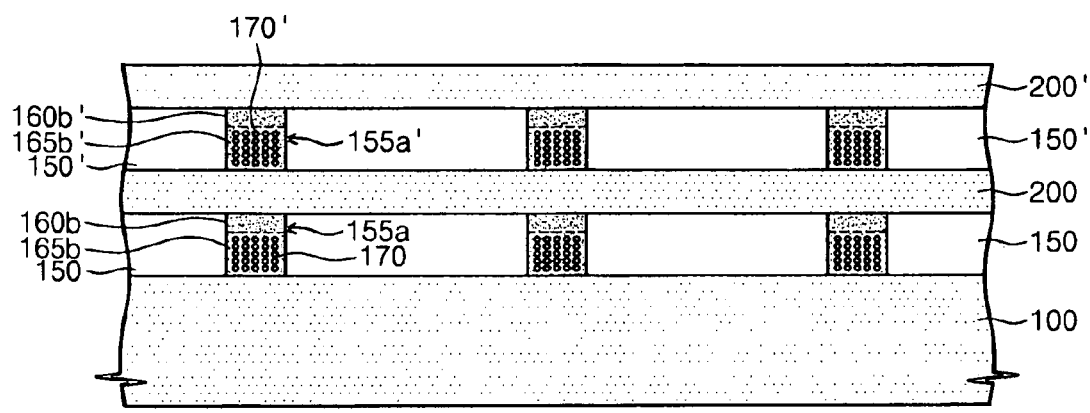
FIG. 3 illustrates a gettering structure according to a third embodiment of the present invention.

FIG. 3 illustrates a gettering structure according to a third embodiment of the present invention. This embodiment is the same as the embodiment of FIG. 2, except that gettering sites 170 and 170' are not formed in an upper portions of the semiconductor patterns 160b and 160b', respectively. As such, the gettering region 165b extends from below an upper surface of the first interlayer insulating layer 150 to a bottom surface of the first interlayer insulating layer 150. Similarly, the gettering layer 165b' extends from below an upper surface of the second interlayer insulating layer 150' to a bottom surface of the second interlayer insulating layer 150'.

As will be appreciated, other numerous variations on these structures are possible. For example, even though the semiconductor material extends from the upper surface of the interlayer insulating layer to the bottom surface of the interlayer insulation layer, the gettering sites may be formed such that the gettering region extends from the upper surface of the interlayer layer insulating layer to above the bottom surface of the interlayer insulating layer.

Figure 4:
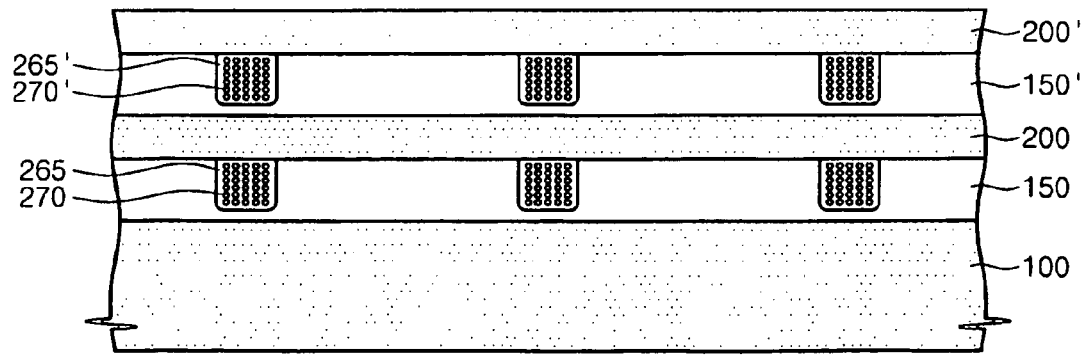
FIG. 4 illustrates a gettering structure according to a further embodiment of the present invention.

FIG. 4 illustrates a gettering structure according to a further embodiment of the present invention. As shown, the structure includes a first interlayer insulating layer 150 formed on a semiconductor substrate 100. Gettering regions 265 are created by forming gettering sites 270 in desired portions of the first interlayer insulating layer 150. The gettering sites 270 may be a dispersoid in the first interlayer insulating layer 150, an interface with the dispersoid, and/or structural imperfections. The structural imperfections may be stacking faults and/or dislocations. For example, the stacking faults and/or dislocations may be created by implantation of H, He, Ar, Si, Ge, Ne, etc.

A first upper semiconductor layer 200 is formed over the first interlayer insulation layer 150. A second interlayer insulation layer 150' is formed over the first upper semiconductor layer 200. Gettering regions 265' are created by forming gettering sites 270' in desired portions of the second interlayer insulating layer 150'. The gettering sites 270' may be a dispersoid in the second interlayer insulating layer 150', an interface with the dispersoid, and/or structural imperfections. The dispersoid may be nitrogen, carbon and/or oxygen. The structural imperfections may be stacking faults and/or dislocations. For example, the stacking faults and/or dislocations may be created by implantation of H, He, Ar, Si, Ge, Ne, etc.

As shown in FIG. 4, the gettering regions 265 and 265' extend from an upper surface of the respective interlayer insulating layer to above a lower surface of the respective interlayer insulating layer. However, gettering regions 265 and 265' may have the extent of the gettering regions shown in FIGS. 2 and 3. Furthermore, other numerous variations on these structure are possible.

Figure 5:
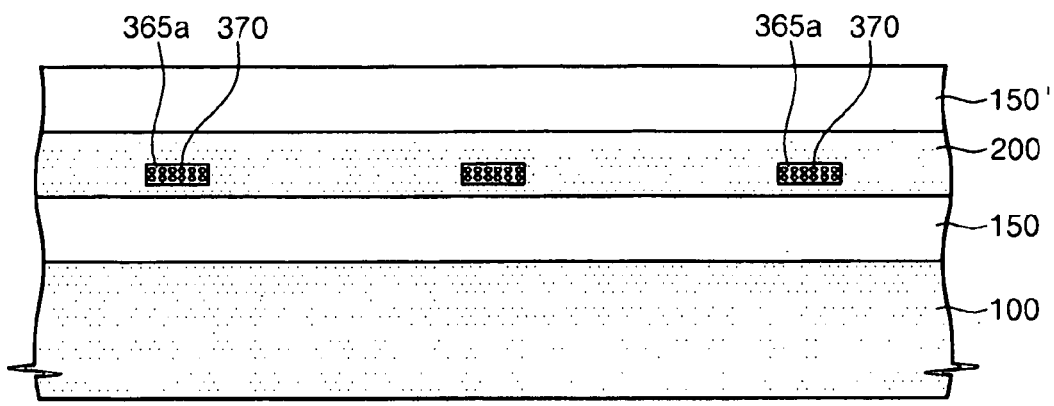
FIG. 5 illustrates a further example of a gettering structure according to the present invention.

FIG. 5 illustrates a further example of a gettering structure according to the present invention. As shown, the structure includes a first interlayer insulating layer 150 formed on a semiconductor substrate 100.

A first upper semiconductor layer 200 is formed over the first interlayer insulation layer 150. Gettering regions 365a are created by forming gettering sites 370 in desired portions of the first upper semiconductor layer 200. The gettering sites 370 may be a dispersoid in the first upper semiconductor layer 200, an interface with the dispersoid, precipitates, and/or structural imperfections. The dispersoid may be nitrogen, carbon and/or oxygen. The precipitates may be $SiO_2$, $SiN_2$, SiC, SiON, etc. The structural imperfections may be stacking faults and/or dislocations. For example, the stacking faults and/or dislocations may be created by implantation of H, He, Ar, Si, Ge, Ne, etc.

Figure 6:
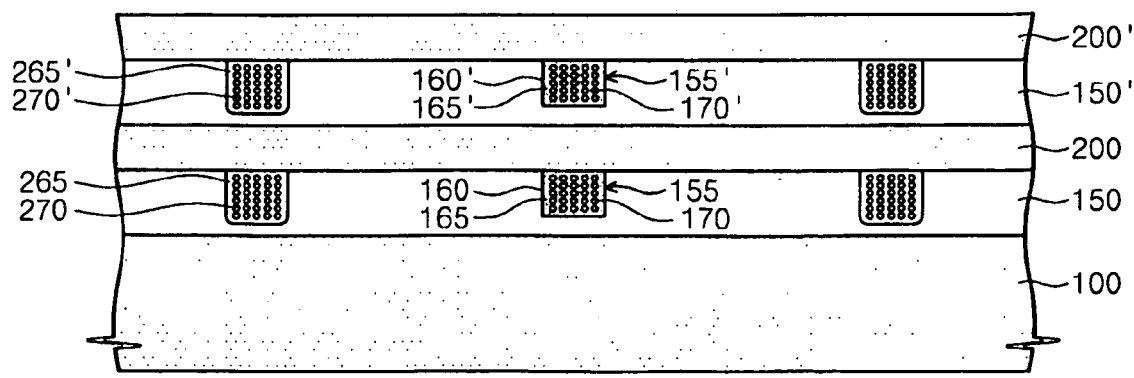
FIG. 6 illustrates an example where the structures of FIGS. 1 and 4 have been combined.

It will be appreciated that the gettering structures described above may be combined in a single device. FIG. 6 illustrates an example where the structure of FIGS. 1 and 4 have been combined.

Figure 7A:
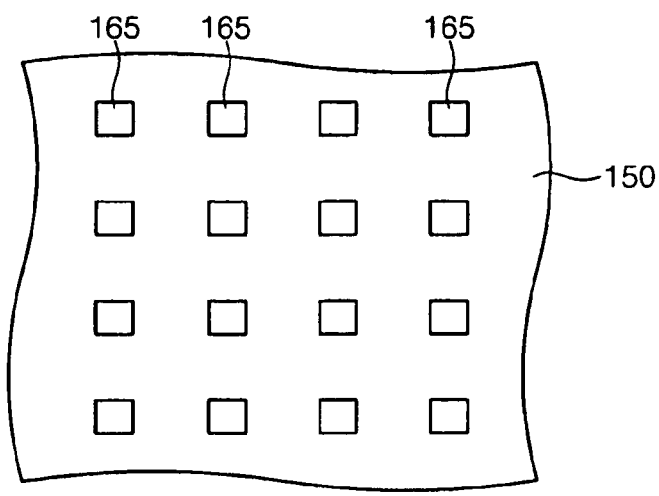
FIG. 7A shows gettering regions having a square shape and arranged in an array.
Figure 7B:
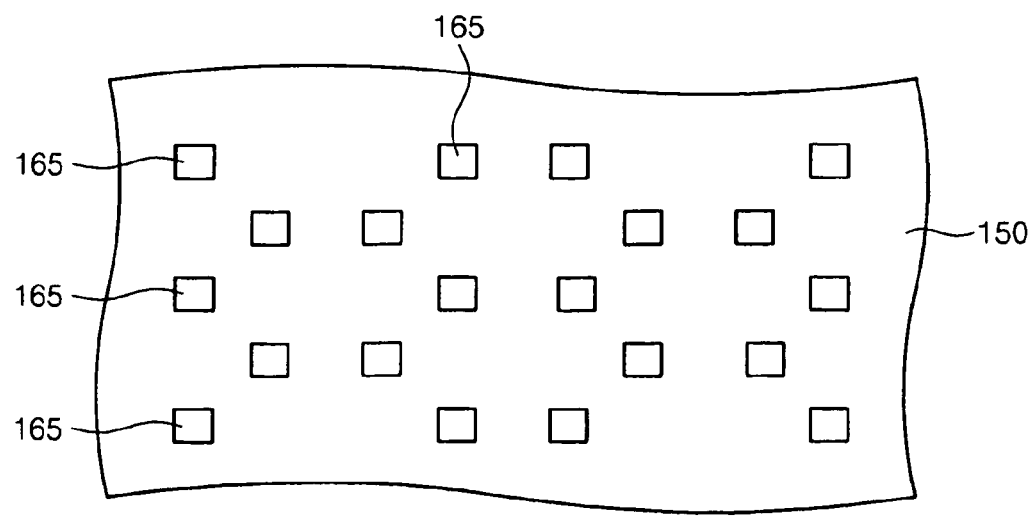
FIG. 7B illustrates gettering regions having a square shape and positioned in a dispersed fashion.
Figure 7C:
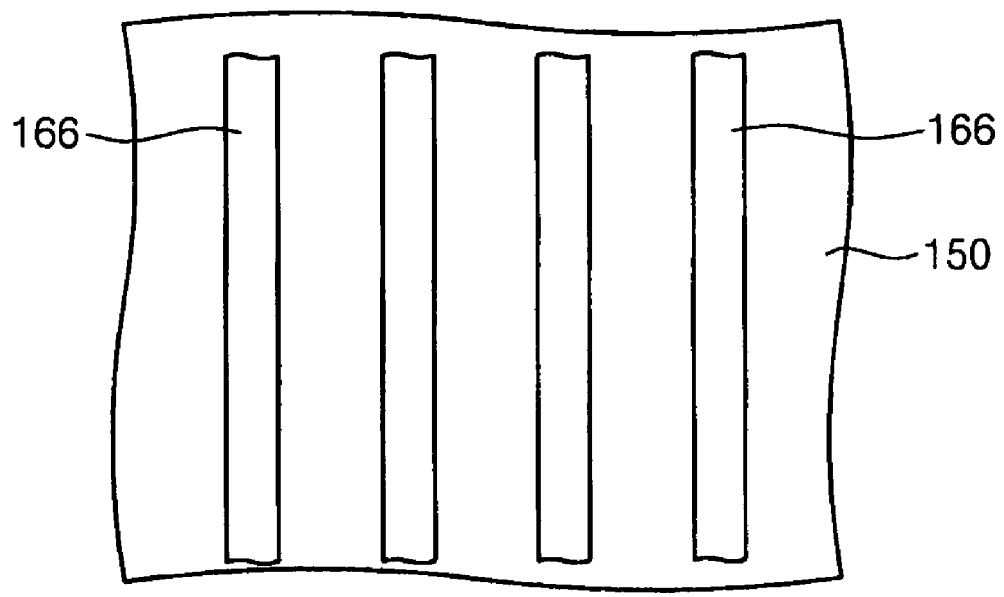
FIG. 7C shows gettering regions as parallel stripes.

While FIGS. 1-6 illustrate cross-sectional views of the different gettering structures, FIGS. 7A-7C illustrated example top down views of different gettering region shapes and arrangements. As non-limiting examples, the gettering regions 165 are depicted in FIGS. 7A-7C. For example, FIG. 7A shows the gettering regions 165 having a square shape and arranged in an array. FIG. 7B illustrates the gettering regions 165 having a square shape and positioned in a dispersed fashion. FIG. 7C shows the gettering regions 165 as parallel stripes. It will be appreciated that numerous other shapes and arrangements are possible.

Next, methods of forming a gettering region according to embodiments of the present invention will be described.

Figure 8:
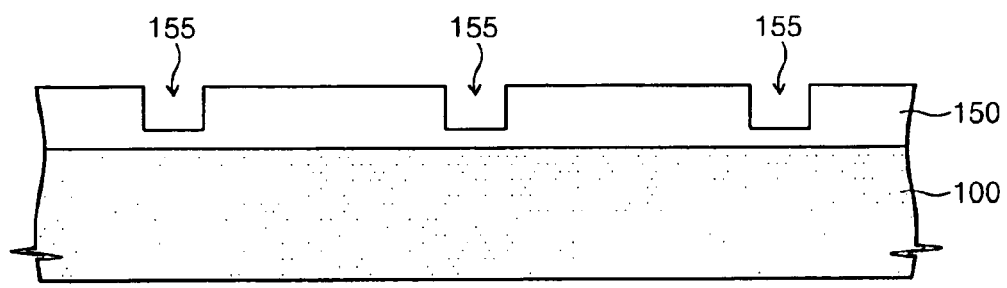
FIGS. 8-9 illustrate a first embodiment of a method for forming a gettering structure according to the present invention.

A first embodiment of a method for forming a gettering structure according to the present invention will be described with respect to FIGS. 8-9. As shown in FIG. 8, the first interlayer insulating layer 150 is formed over the semiconductor substrate 100. Next, cavities 155 are formed in the first interlayer insulating layer 150 at desired positions (to create a desired arrangement) and in a desired shape. The cavities 155 may be formed by any well-known patterning and etching process. The etching may be controlled, as is known, to control the depth of the cavities 155. FIG. 8 shows the cavities being formed in, but not completely through, the first interlayer insulating layer 150 commensurate with the gettering structure of FIG. 1.

Figure 9:
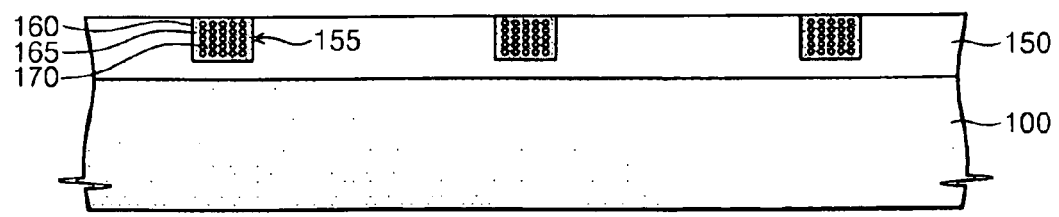

As shown in FIG. 9, a semiconductor material layer is formed over the first interlayer insulating layer 150 and etched back to expose the first interlayer insulating layer 150. Accordingly, semiconductor patterns 160 are formed in the cavities 155. The semiconductor material may be amorphous silicon, single crystal silicon, poly crystal silicon, poly crystal silicon having nano scale grains, etc. and any combination of the above. The etch back may be performed by, for example, chemical mechanical polishing.

Next, gettering sites 170 are formed in the semiconductor patterns 160 by ion implantation; for example, implantation of H, He, Ar, Si, Ge, Ne, etc. As will be appreciated, a mask pattern may be formed over the first interlayer insulating layer 150 exposing the semiconductor patterns 160 prior to implantation. Formation of the gettering sites 170 creates the gettering regions 165.

An upper semiconductor layer may be formed over the resulting structure and the above described process steps repeated to form subsequent gettering structure layers as shown in FIG. 1.

As will be appreciated, the gettering structure of FIG. 2 may be formed in the same manner by controlling the etching of the interlayer insulating layer such that the cavities 155 extend completely through the interlayer insulating layer 150.

As will be further appreciated, the gettering structure of FIG. 3 may be formed in the same manner by controlling the implantation energies such that the ions are implanted below the upper surface of the interlayer insulating layer 150.

As a still further alternative, in the formation of the gettering structures of FIGS. 2 and 3, the semiconductor patterns 160 may be grown in the cavities 155 according to an epitaxial growing process using the semiconductor substrate 100 as a seed layer.

Next, a second embodiment of a method for forming a gettering structure according to the present invention will be described with respect to FIGS. 8-9. As shown in FIG. 8, the first interlayer insulating layer 150 is formed over the semiconductor substrate 100. Next, cavities 155 are formed in the first interlayer insulating layer 150 at desired positions (to create a desired arrangement) and in a desired shape. The cavities 155 may be formed by any well-known patterning and etching process. The etching may be controlled, as is known, to control the depth of the cavities 155. FIG. 8 shows the cavities being formed in, but not completely through, the first interlayer insulating layer commensurate with the gettering structure of FIG. 1.

As shown in FIG. 9, a semiconductor material layer is formed over the first interlayer insulating layer 150 and etched back to expose the first interlayer insulating layer 150. Accordingly, semiconductor patterns 160 are formed in the cavities 155. The etch back may be performed by, for example, chemical mechanical polishing.

The semiconductor material may be amorphous silicon, single crystal silicon, poly crystal silicon, poly crystal silicon having nano scale grains, etc. and any combination of the above. The semiconductor material may be formed by chemical vapor deposition (CVD). Furthermore, deposition of the semiconductor material may take place while supplying source gases that contain at least one of N, C, O, H, He, Ar, Si, Ge, Ne, etc. In this manner, gettering sites 170 are formed in the semiconductor patterns 160, and gettering regions 165 are formed.

An upper semiconductor layer may be formed over the resulting structure and the above described process steps repeated to form subsequent gettering structure layers as shown in FIG. 1.

As will be appreciated, the gettering structure of FIG. 2 may be formed in the same manner by controlling the etching of the interlayer insulating layer such that the cavities 155 extend completely through the interlayer insulating layer 150.

As will be appreciated, the gettering structure of FIG. 3 may be formed in the same manner by terminating the supply of the source gases before the semiconductor material completely fills the cavity 155.

As a still further alternative, in the formation of the gettering structures of FIGS. 2 and 3, the semiconductor patterns 160 may be grown in the cavities 155 according to an epitaxial growing process using the semiconductor substrate 100 as a seed layer.

Next another embodiment for a method of forming a gettering region according to the present invention will be described with respect to FIGS. 10-12

Figure 10:
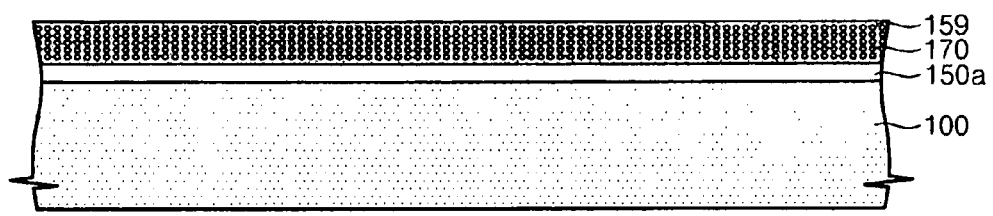
FIGS. 10-12 illustrate another embodiment for a method of forming a gettering region according to the present invention.

As shown in FIG. 10, an interlayer insulating layer 150a is formed over a semiconductor substrate 100. Then, a semiconductor layer 159 having gettering sites 170 is formed over the interlayer insulating layer 150a. The semiconductor layer 159 may be formed by CVD. The gettering sites 170 may be formed by supplying source gases that contain at least one of N, C, O, H, He, Ar, Si, Ge, Ne, etc; or the gettering sites 170 may be formed by ion implantation of, for example, H, He, Ar, Si, Ge, Ne, etc.

Figure 11:
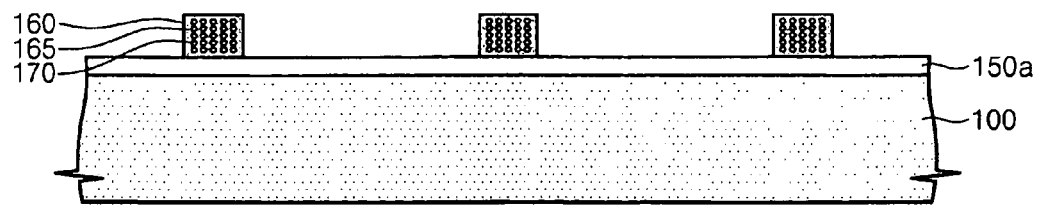

Next, as shown in FIG. 11, the semiconductor layer 159 is patterned using any conventional patterning technique (e.g., photo resist mask and etching) to form semiconductor patterns 160.

Figure 12:
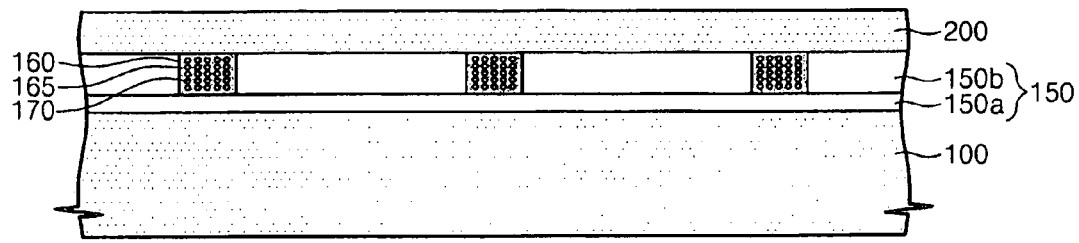

As shown in FIG. 12, a further interlayer insulating layer 150b is formed over the resulting structure and etched back to expose the semiconductor patterns 160. The etch back may be performed by chemical mechanical polishing. As a result of this process, the semiconductor patterns 160 are formed in an interlayer insulating layer 150. Namely, gettering regions 165 are formed in the interlayer insulating layer 150. A semiconductor layer 200 may then be formed over the interlayer insulating layer 150.

The above described process steps may be repeated to form subsequent gettering structure layers as shown in FIG. 1.

As will be appreciated, the gettering structure of FIG. 2 may be formed in the same manner by eliminating the formation of the interlayer insulating layer 150a.

As will be further appreciated, the gettering structure of FIG. 3 may be formed in the same manner by controlling the implantation energies such that the ions are implanted below the upper surface of the semiconductor layer 160. Or, the gettering structure of FIG. 3 may be formed by terminating the supply of the source gases before the semiconductor layer 159 is completely formed.

As a still further alternative, in the formation of the gettering structures of FIGS. 2 and 3, the semiconductor layer 159 may be grown according to an epitaxial growing process using the semiconductor substrate as a seed layer.

Next, a further embodiment for a method of forming a gettering region according to the present invention will be described with respect to FIGS. 13-14. This embodiment may be employed to form the gettering structure of FIG. 4.

Figure 13:
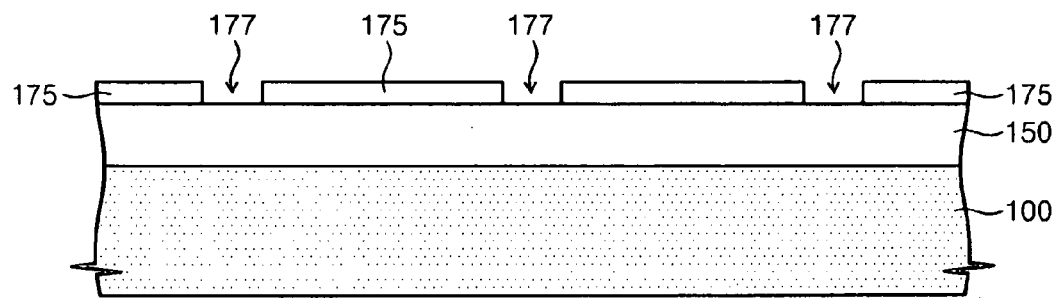
FIGS. 13-14 illustrate a further embodiment for a method of forming a gettering region according to the present invention.
Figure 14:
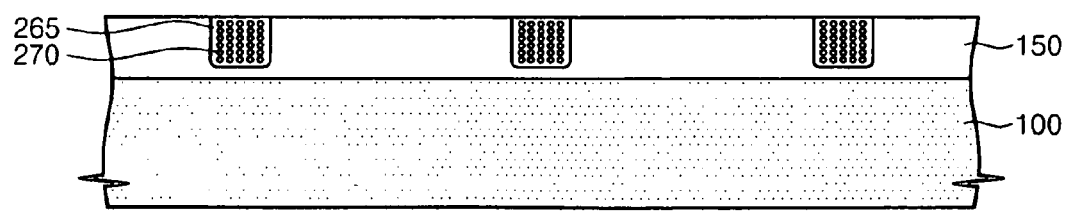

As shown in FIG. 13, the first interlayer insulating layer 150 is formed over the semiconductor substrate 100. Next, a mask pattern 175 is formed over the first interlayer insulating layer 150. The mask pattern 175 may be formed by depositing a photo-resist and performing a photo-development process. As shown in FIG. 14, using the mask pattern 175 as a mask, gettering sites 270 are formed in the first interlayer insulating layer 150 by ion implantation; for example, implantation of H, He, Ar, Si, Ge, Ne, etc. Formation of the gettering sites 270 creates the gettering regions 265. The mask pattern 175 is then removed in any well-known manner.

An upper semiconductor layer may be formed over the resulting structure and the above described process steps repeated to form subsequent gettering structure layers as shown in FIG. 4.

Another embodiment for a method of forming a gettering region according to the present invention will now be described with respect to FIGS. 15, 16, 17A, 18A, 19A and 20. This embodiment may be employed to form the gettering structure of FIG. 5.

Figure 15:
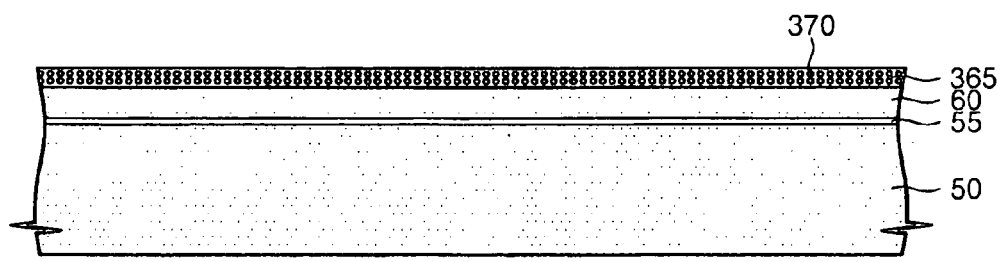
FIGS. 15, 16, 17A, 18A, 19A, and 20 illustrate another embodiment for a method of forming a gettering region according to the present invention.

As shown in FIG. 15, a separating layer 55 is formed in a semiconductor substrate 50 by ion implantation of hydrogen. This also forms a single crystal semiconductor layer 60 above the separating layer 55. Next, a getter layer 365 is formed over the single crystal semiconductor layer 60. The gettering layer 365 includes gettering sites 370. The gettering layer 365 with gettering sites 370 may be formed according any process previously described in this disclosure.

Figure 16:
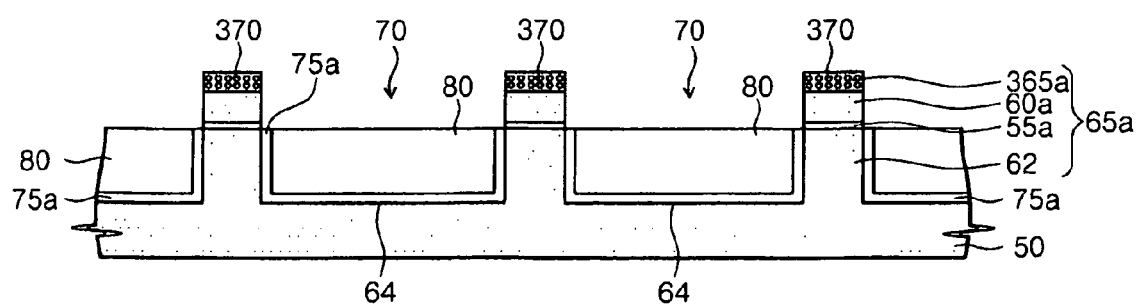

Then, a mask pattern (not shown) is formed over the gettering layer 365. The gettering layer 365, single crystal semiconductor layer 60, separating layer 55 and semiconductor substrate 50 are etched to form cavities 64 defining protruded patterns 65a as shown in FIG. 16. The mask pattern may then be removed. The protruded patterns 65a includes a pillar pattern 62, a separation pattern 55a, a single crystal semiconductor pattern 60a and a gettering pattern 365a.

A deposition prohibiting material and a sacrificial material are formed over the substrate 50, and the sacrificial material is removed until the separating pattern 55a is exposed. Then, the deposition prohibiting material not covered by the sacrificial material is removed. This results in the formation of a deposition prohibiting layer 75a and sacrificial layer 80 as shown in FIG. 16.

Figure 17A:
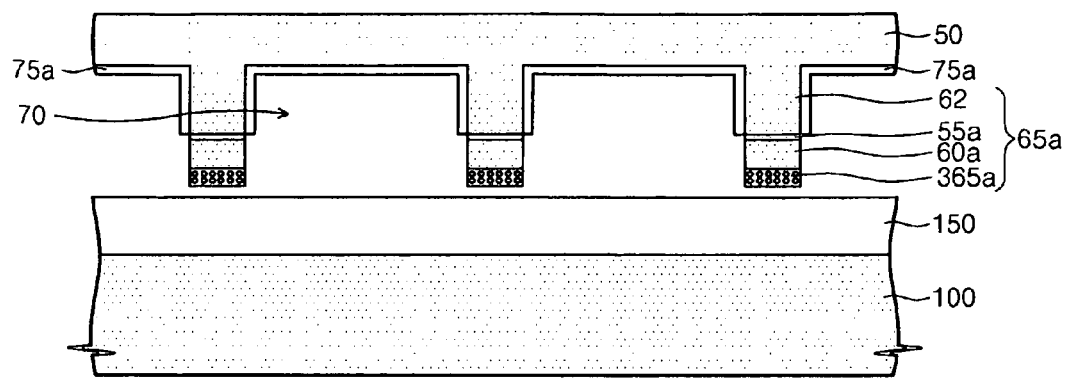

As shown in FIG. 17A, the sacrificial layer 80 is removed, which will form openings 70 for gas flow in later processes. The semiconductor substrate 50 is positioned such that the protruded portions 65a protrude towards a first interlayer insulating 150 formed on a semiconductor substrate 100.

Figure 18A:
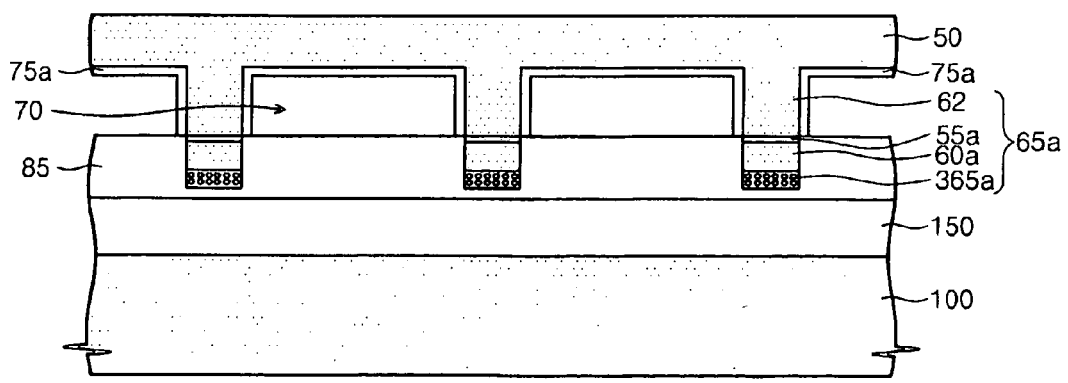

Then, as shown in FIG. 18A, a secondary semiconductor layer 85 is formed on the first interlayer insulating layer 150 to cover portions of the protruded patterns 65a not covered by the deposition prohibition layer 75a. The secondary semiconductor layer 85 may be formed by CVD or an epitaxial growing process. If the epitaxial growing process is used, the single crystal semiconductor pattern 60a serves as a seed layer, and the secondary semiconductor layer 85 becomes a single crystal semiconductor layer. As will be appreciated, the deposition prohibition layer 75a prevents the formation of semiconductor material thereon.

Figure 19A:
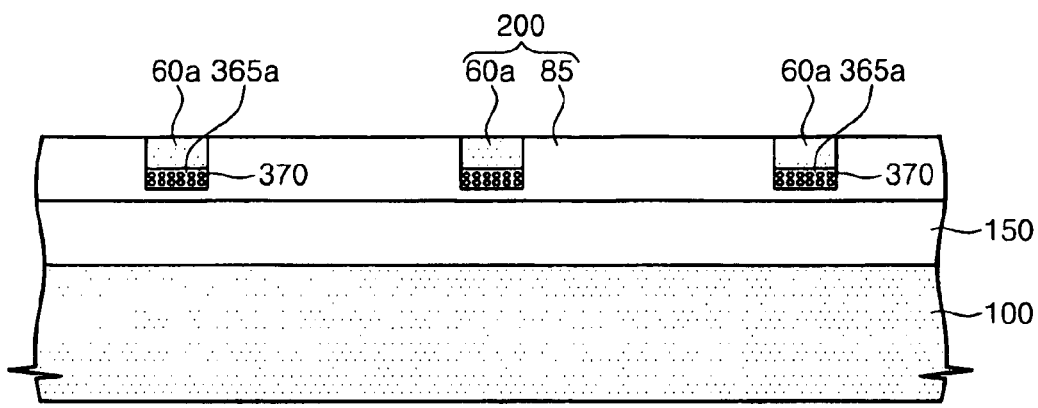
Figure 20:
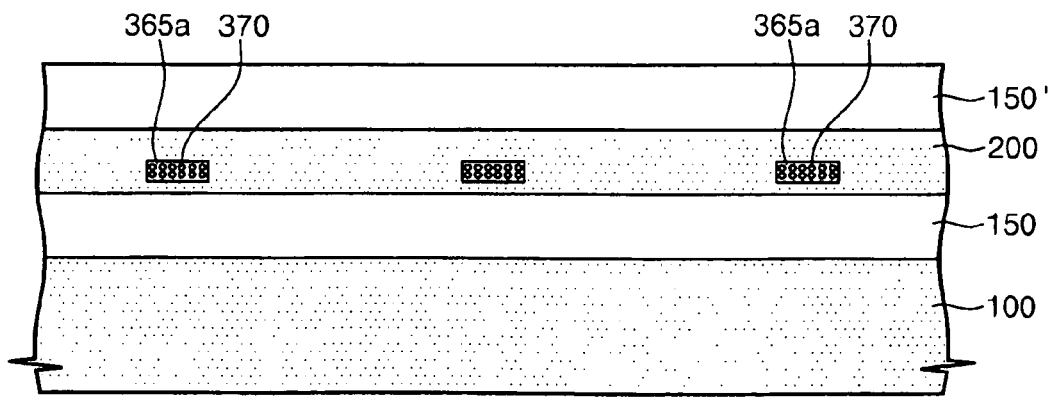

A heating process is then performed to separate the substrate 50 at the separation patterns 55a and leave the structure shown in FIG. 19A. Namely, gettering regions 365a are formed in the secondary semiconductor layer 85, which is the upper semiconductor layer 200 in FIG. 5. A second interlayer insulation layer 150' may then be formed on the upper semiconductor layer 200 as shown in FIG. 20.

FIGS. 17A, 18A, and 19A illustrates a method of forming an upper semiconductor layer, and do so for the gettering structure of FIG. 5.

Next, other methods for forming an upper semiconductor layer such as shown in FIGS. 1-4 will be described with respect to FIGS. 17B, 18B and 19B and FIGS. 21-24.

Figure 17B:
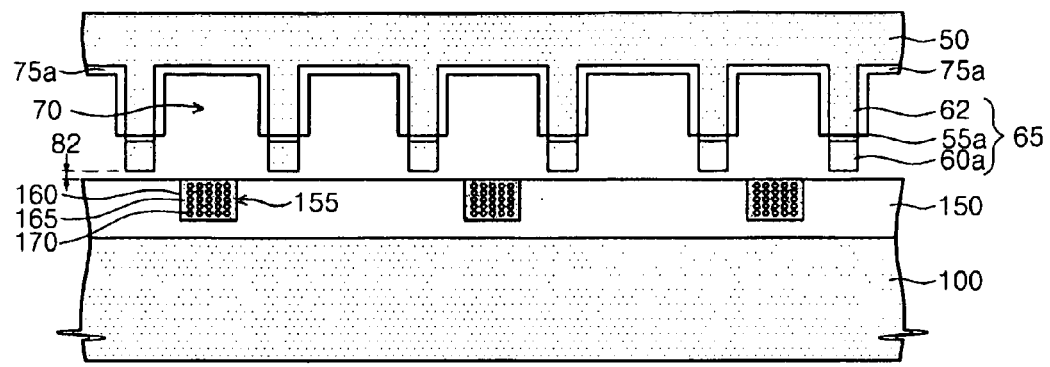
FIGS. 17B, 18B, 19B illustrates an embodiment of a method of forming an upper semiconductor layer.
Figure 18B:
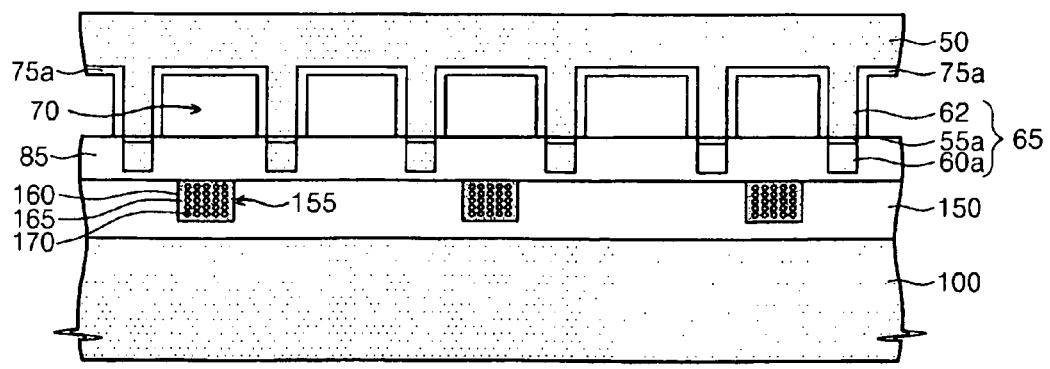
Figure 19B:
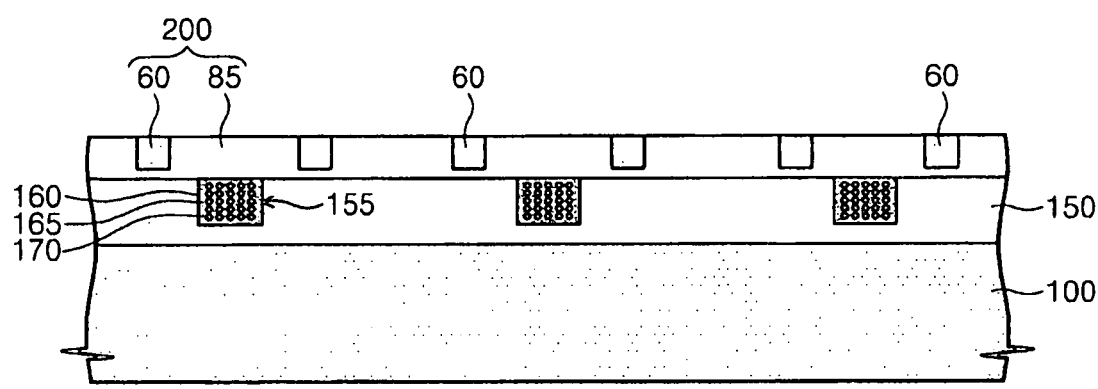

For the purposes of discussion only, assume the method of FIG. 8-9 or 10-12 was first performed. The embodiment of forming the upper semiconductor layer in FIGS. 17B, 18B and 19B is the same as the embodiment illustrated in FIGS. 17A, 18A and 19A, except that the protruded portion 65a' does not include the gettering pattern 365a. Instead, as discussed above, the gettering regions 165 were formed according to the embodiments described with respect to FIG. 8-9 or 10-12. Except for this difference the method is the same as previously described above with respect to FIGS. 17A, 18A, and 19A; therefore, this description will not be repeated.

For the purposes of discussion only, assume the method of FIGS. 13 and 14 has first been performed with respect to each of the method embodiments described below with respect to FIGS. 21-24.

Figure 21:
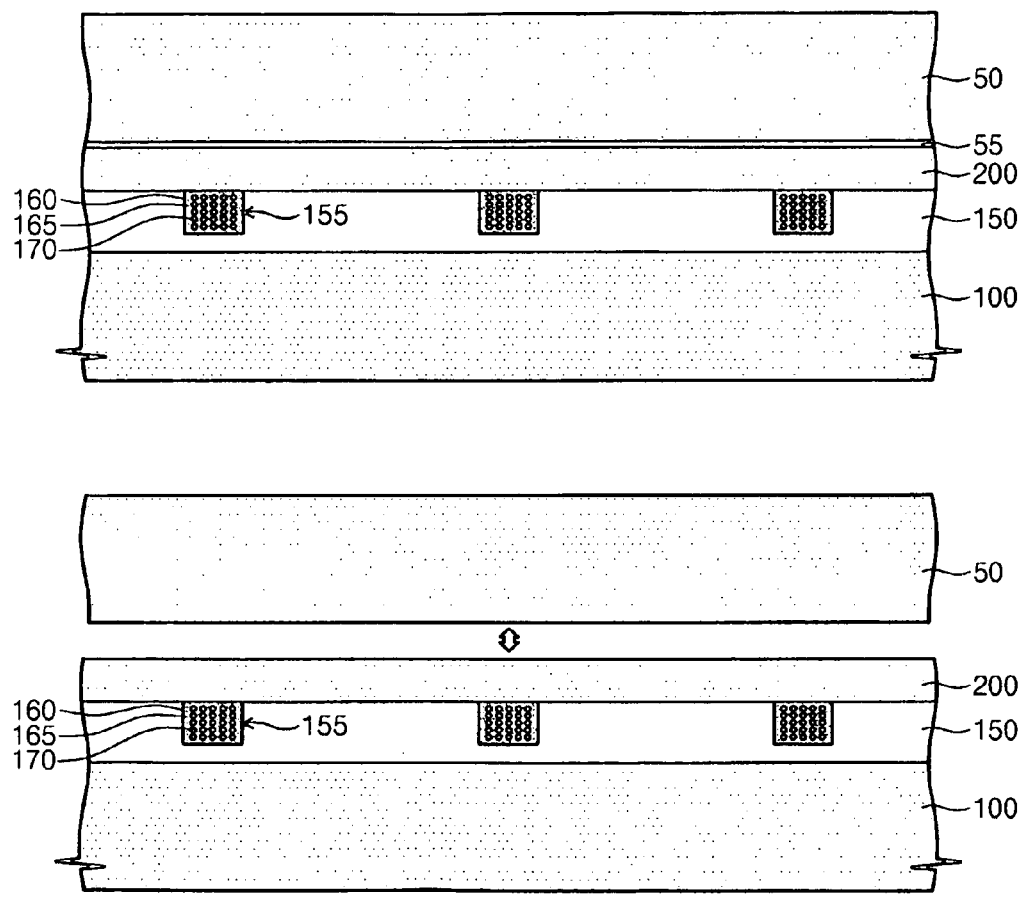
FIG. 21 illustrates another embodiment of a method of forming an upper semiconductor layer.

Another embodiment of a method of forming an upper semiconductor layer will be described with respect to FIG. 21.

This method is conventional in the art and often referred to as the smart cut method. As shown, a donor wafer 50 is placed on the interlayer insulating layer 150. A separating layer 55 is formed in the donor wafer 50 at a desired height above the interlayer insulating layer 150. The separating layer 55 may be formed by ion implantation of hydrogen. The portion of the donor wafer 50 between the separating layer 55 and the interlayer insulating layer 150 will become the upper semiconductor layer 200. Heat is then applied, which causes the donor wafer to separate from the upper semiconductor layer 200 at the separating layer 55.

Figure 22:
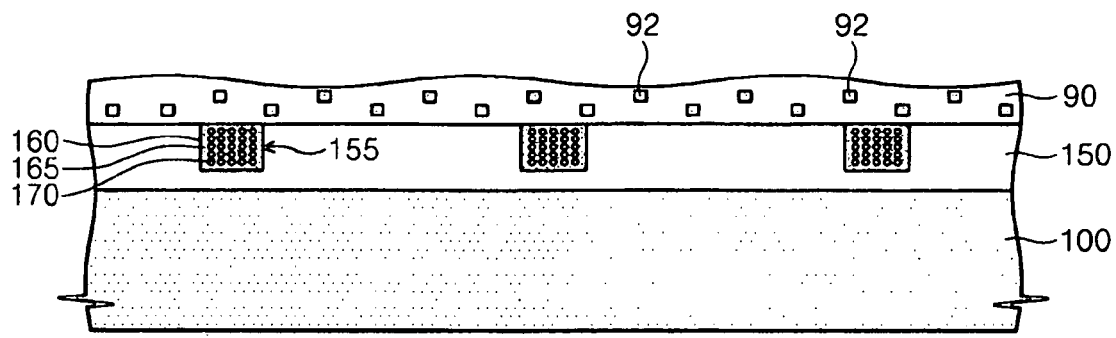
FIGS. 22-23 illustrate a second embodiment of a method of forming an upper semiconductor layer.
Figure 23:
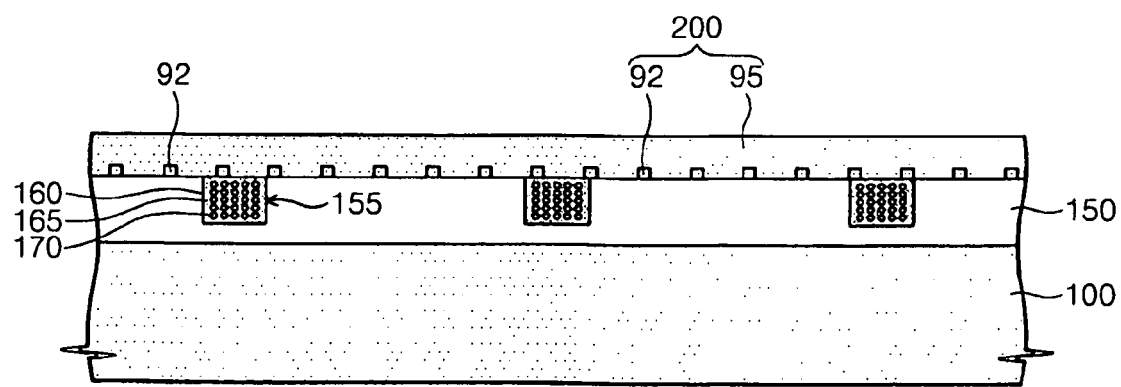

A second embodiment of a method of forming an upper semiconductor layer will be described with respect to FIGS. 22-23. In this embodiment, a carrier solution 90 is coated over the interlayer insulation layer 150 as shown in FIG. 22. The carrier solution 90 includes a solvent and single crystal semiconductor patterns 92. Then, the solvent is removed by an appropriate process such as heating, and an epitaxial growing process is carried out using the single crystal semiconductor patterns 92 as a seed layer to form a semiconductor layer 95. The semiconductor layer 95 and patterns 92 form the upper semiconductor layer 200.

Figure 24:
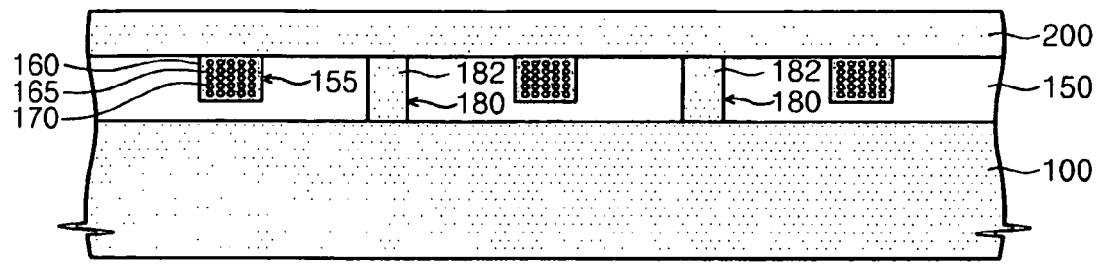
FIG. 24 illustrates a third embodiment of a method of forming an upper semiconductor layer.

A third embodiment of a method of forming an upper semiconductor layer will be described with respect to FIG. 24. In this embodiment, contact holes 180 are formed in the interlayer insulating layer 150 to expose the semiconductor substrate 100, and semiconductor contact plugs 182 are formed in the contact holes 180 as shown in FIG. 24. The contact plugs 182 may be formed by an epitaxial growing process using the semiconductor substrate 100 as a seed layer. The upper semiconductor layer 200 is then formed by an epitaxial growing process (e.g., solid phase epitaxial process) using the contact plugs 182 as a seed layer.

Next, various applications of the embodiments of the present invention will be described. In particular, application to memory devices will be described.

Figure 25:
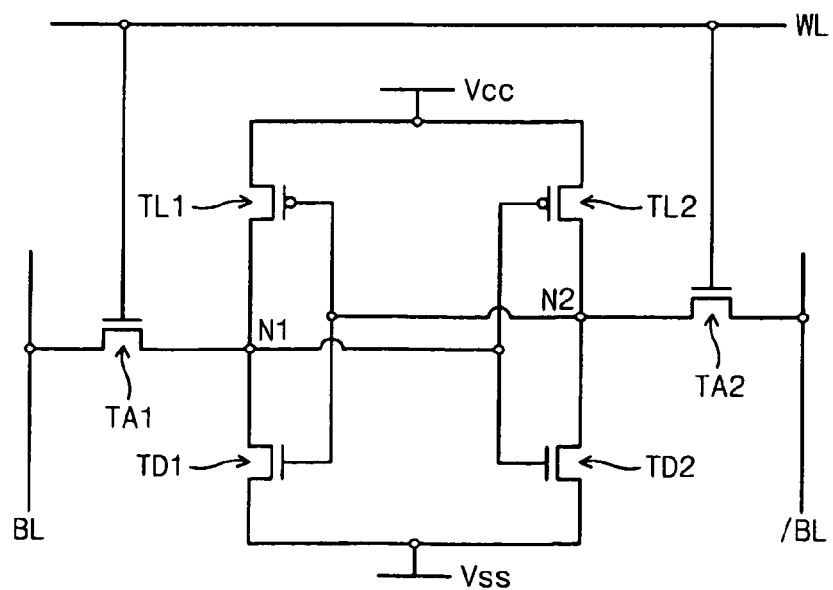
FIG. 25 illustrates a well-known circuit diagram of an SRAM device.

FIG. 25 illustrates a well-known circuit diagram of an SRAM device. As shown, a first PMOS load transistor TL1 and a first NMOS driver transistor TD1 are connected in series between a power supply voltage Vcc and a reference voltage (e.g., ground) Vss. A first node N1 is at the connection between the first PMOS load transistor TL1 and the first NMOS driver transistor TD1. A second PMOS load transistor TL2 and second NMOS driver transistor TD2 are connected in series between the power supply voltage Vcc and ground Vss. A second node N2 is at the connection between the second PMOS load transistor TL2 and the second NMOS driver transistor TD2. The gates of the first PMOS load transistor and the first NMOS driver transistor are connected together and connected to the second node N2. The gates of the second PMOS load transistor TL2 and the second NMOS driver transistor TD2 are connected together and connected to the first node N1.

A first transfer transistor TA1, which is NMOS, is connected between a bit line and the first node N1. A gate of the first transfer transistor TA1 is connected to a word line WL. A second transfer transistor TA2, which is NMOS, is connected between an inverse bit line /BL and the second node N2. A gate of the second transfer transistor TA2 is connected to the word line WL. Because the operation of this SRAM circuit is so well-known, a description of the operation will be omitted for the sake of brevity.

Figure 26:
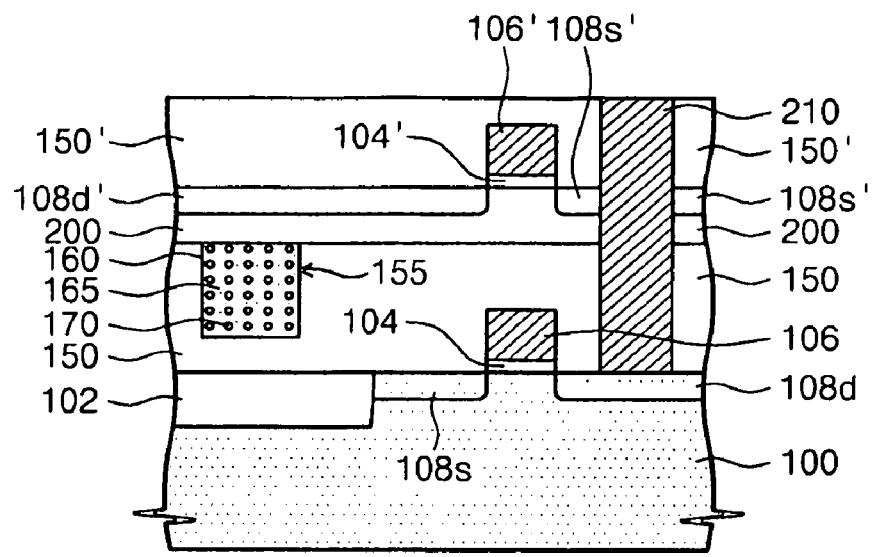
FIG. 26 illustrates one embodiment of the structure of a load transistor connected in series with a driver transistor shown in FIG. 25 with the embodiment of FIG. 1 applied thereto.

FIG. 26 illustrates one embodiment of the structure of a load transistor connected in series with a driver transistor shown in FIG. 25 with the embodiment of FIG. 1 applied thereto. As shown, an isolation layer 102 is formed in a semiconductor substrate 100 to define an active region. A first gate insulating layer 104 and a first gate electrode 106 are formed over the active layer, and source 108s and drain 108d regions are formed on either side of the first gate electrode 106, respectively, in the semiconductor substrate 100. A first interlayer insulating layer 150 covers the semiconductor substrate 100. According to one of the above described embodiments, a semiconductor pattern 160 having gettering sites 170 and forming a gettering region 165 is formed in the interlayer insulating layer 150. An upper semiconductor layer 200 is formed over the interlayer insulation layer 150. A second gate insulating layer 104' and a second gate electrode 106' are formed over the upper semiconductor layer 200, and source 108s' and drain 108d' regions are formed on either side of the second gate electrode 106', respectively, in the upper semiconductor layer 200.

A second interlayer insulating layer 150' covers the upper semiconductor layer 200. A conductive plug 210 is formed in the resulting structure to connect the drain region 108d and the source region 108s'. While not described in detail above, the semiconductor substrate 100 and the upper semiconductor layer 200 are doped such that the first gate electrode 106 forms part of an NMOS transistor and the second gate electrode 106' forms part of a PMOS transistor.

Figure 27:
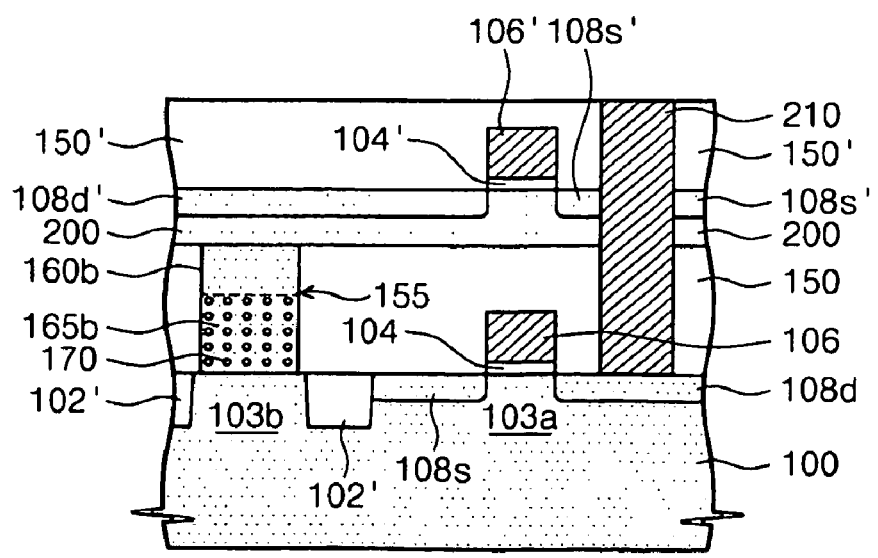
FIG. 27 illustrates one embodiment of the structure of a load transistor connected in series with a driver transistor shown in FIG. 25 with the embodiment of FIG. 3 applied thereto.

FIG. 27 illustrates one embodiment of the structure of a load transistor connected in series with a driver transistor shown in FIG. 25 with the embodiment of FIG. 3 applied thereto. The structure of FIG. 27 is the same as the structure of FIG. 26, except that the isolation layers 102' define a first active region 103a and a second active region 103b, and a semiconductor pattern 160b with gettering sites 170 forms a gettering region 165b according to the embodiment of FIG. 3 in contact with the second active region 103b.

Figure 28:
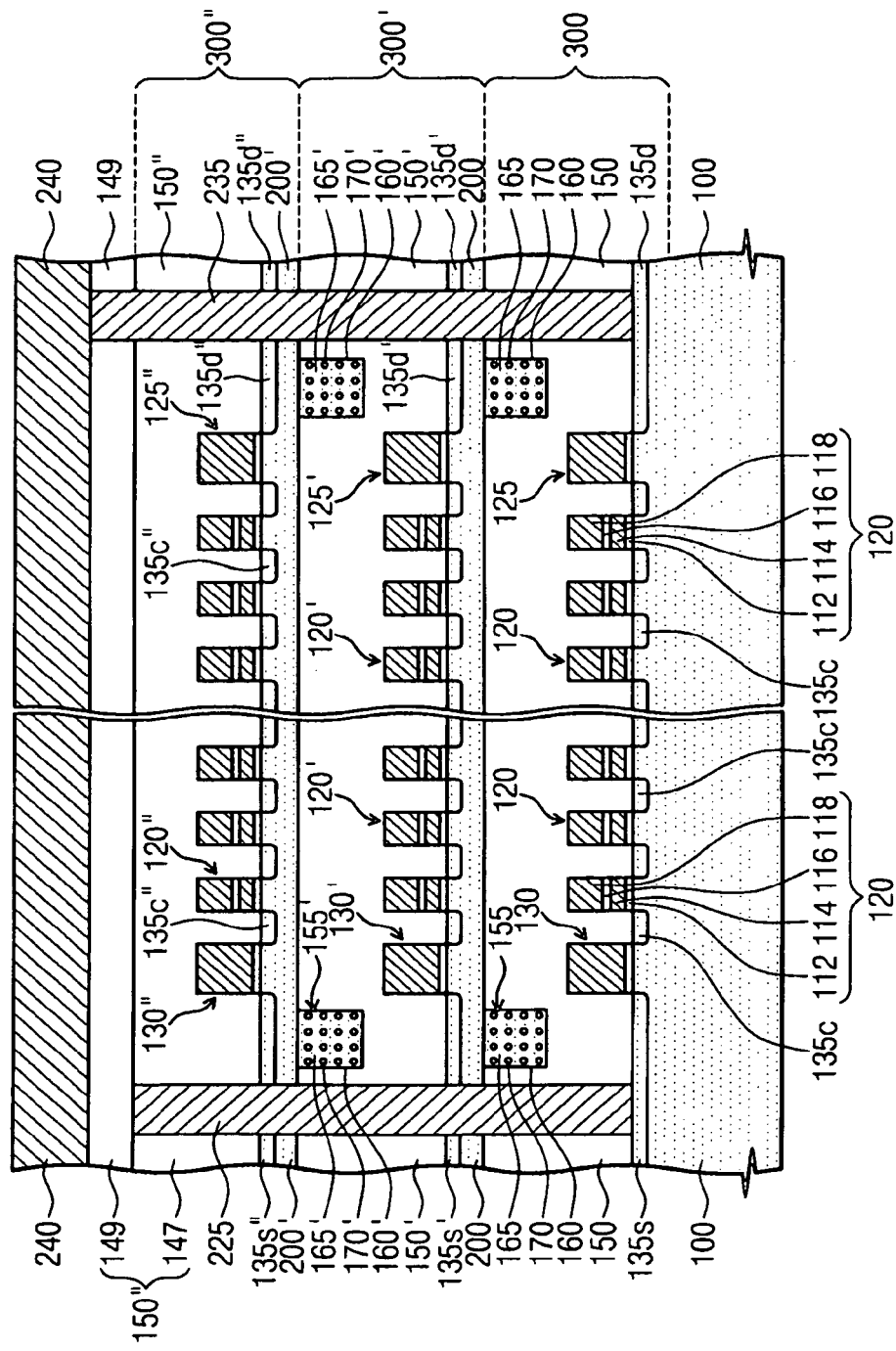
FIG. 28 illustrates application of the embodiment of FIG. 1 to a NAND memory device of a first architecture.
Figure 29:
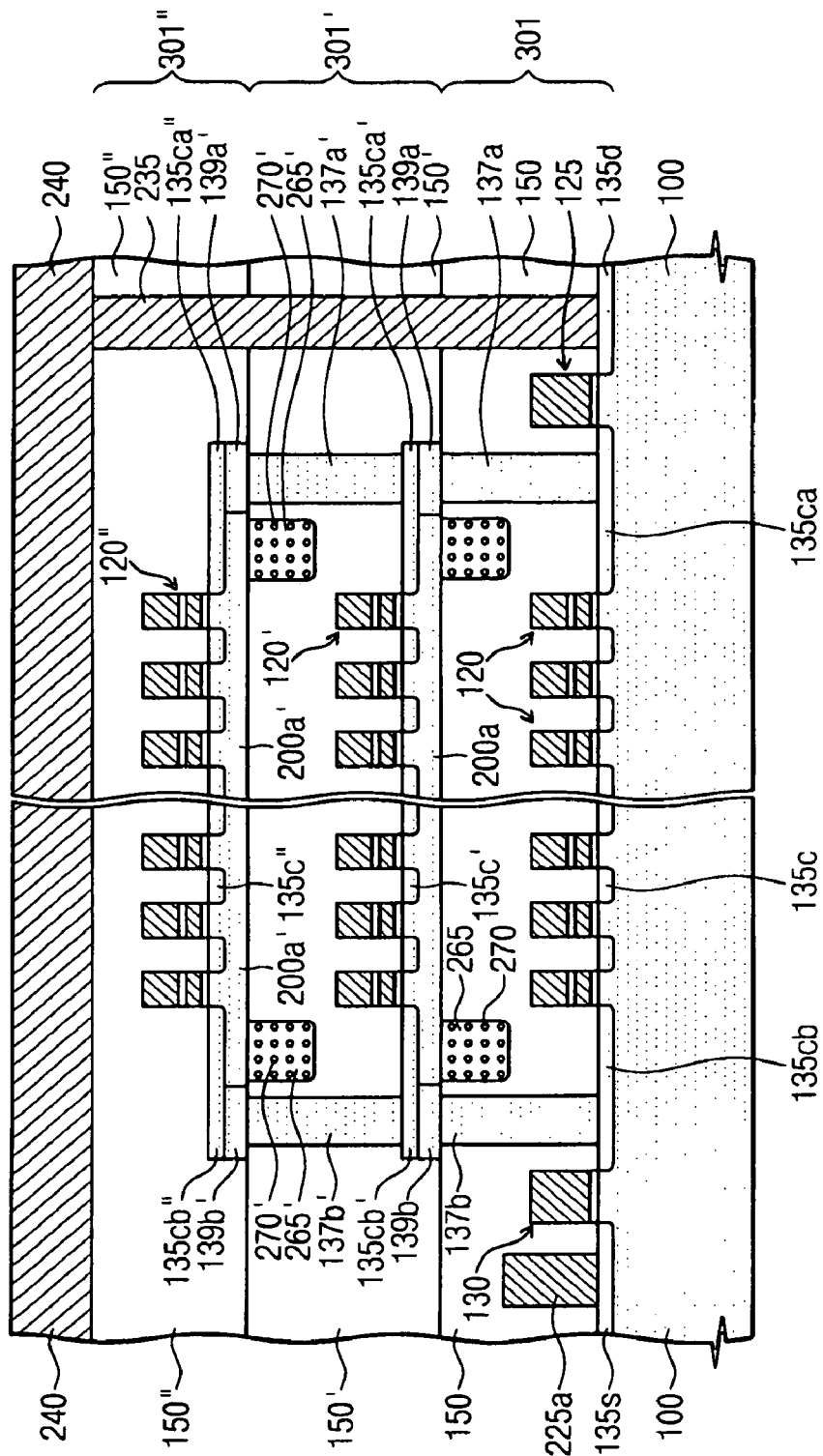
FIG. 29 illustrates application of the embodiment of FIG. 1 to a NAND memory device of a second architecture.
Figure 30:
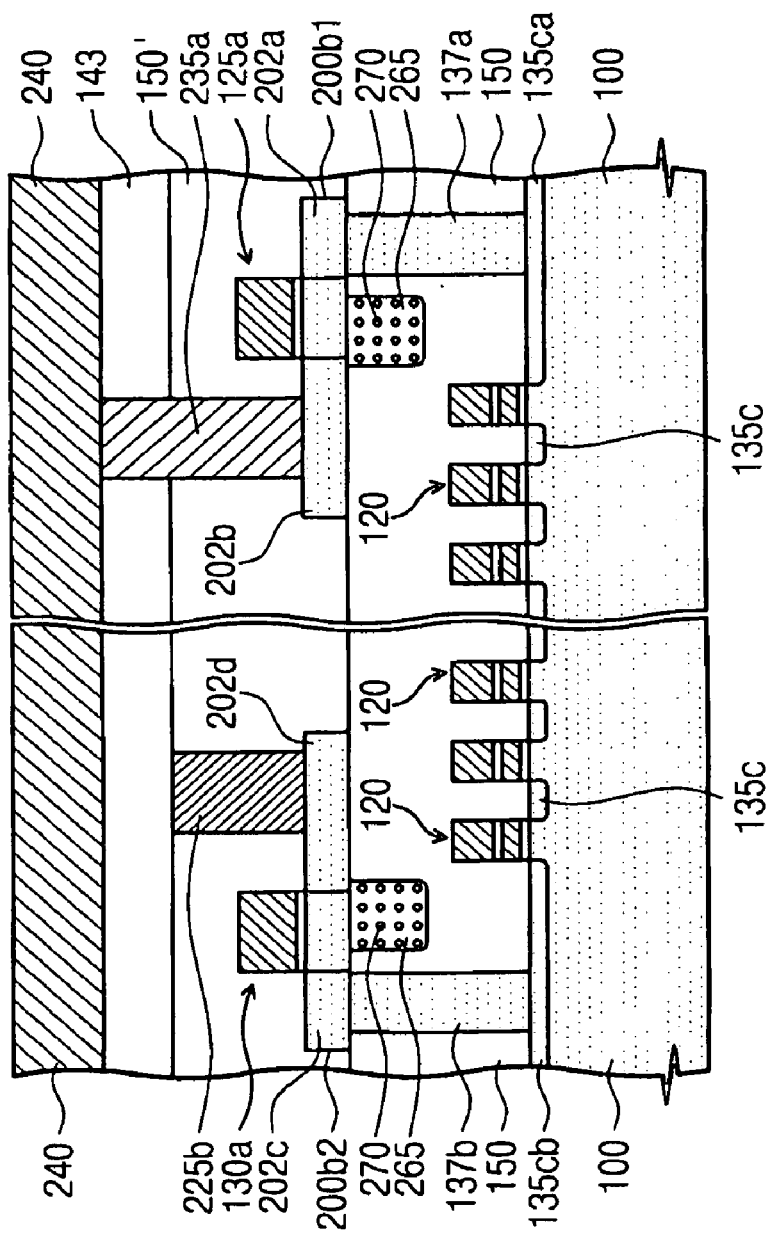
FIG. 30 illustrates application of the embodiment of FIG. 1 to a NAND memory device of a third architecture.

Application of the embodiments of the present invention is not limited to SRAM devices. Instead, the present invention may be applied to any memory device; for example, non-volatile memory devices. FIG. 28 illustrates application of the embodiment of FIG. 1 to a NAND memory device of a first architecture. FIG. 29 illustrates application of the embodiment of FIG. 1 to a NAND memory device of a second architecture. FIG. 30 illustrates application of the embodiment of FIG. 1 to a NAND memory device of a third architecture.

Referring to FIG. 28, the NAND memory device of a first architecture includes a plurality of cell gate patterns 120 disposed over a semiconductor substrate 100. Cell source/drain regions 135c are disposed in the semiconductor substrate 100 between the cell gate patterns 120. Each cell gate pattern includes a tunnel oxide 112 formed over the semiconductor substrate, a floating gate 114 formed over the tunnel oxide 112, an insulating layer 116 formed over the floating gate 114, and a control gate 118 formed over the insulating layer 116. At one end of the string of cell gate patterns 120 is a string select gate pattern 125. At the other end of the string of cell gate patterns 120 is a ground select gate pattern 130. The string select gate pattern and the ground select gate pattern both include a gate electrode formed over an insulating layer on the semiconductor substrate 100.

Adjacent the string select gate pattern 125 is a common drain region 135d formed in the semiconductor substrate 100. Correspondingly, a common source region 135s is formed adjacent to the ground select gate pattern 130. A first interlayer insulating layer 150 is formed over the resulting structure. According to one of the above described embodiments, the gettering structure of FIG. 1 is then formed in the first interlayer insulating layer 150 at either end of the string of cell gate patterns 120. In particular, a semiconductor pattern 160 having gettering sites 170 and forming a gettering region 165 is formed in the first interlayer insulating layer 150 at either end of the string of cell gate patterns 120. The resulting structure forms a first NAND memory layer 300.

A first upper semiconductor layer 200 is formed over the first interlayer insulating layer 150. A second NAND memory layer 300' is formed to have the same structure as the first NAND memory layer 300 by treating the first upper semiconductor layer 200 as a semiconductor substrate. This may be repeated to form a third NAND memory layer 300" using a second upper semiconductor layer 200' as a semiconductor substrate. However, the getting regions are not formed in the third NAND layer 300".

As shown in FIG. 28, a first common source pattern 225 is formed through the first, second and third NAND layers 300, 300', 300" in contact with the first, second and third common source regions 135s, 135s' and 135s"'. An insulating layer 149 is formed over the third interlayer insulating layer 150". A bit line contact plug 235 is formed through the first, second and third NAND layers 300, 300' and 300" to contact the first, second and third common drain regions 135d, 135d' and 135d"'. A bit line 240 is formed over the insulating layer 149, and makes contact with the bit line contact plug 235.

Referring to FIG. 29, a second architecture of a NAND memory device structure will be described. As shown, a plurality of cell gate patterns 120 are formed over a semiconductor substrate 100. Adjacent to and disposed away from the outermost cell gate patterns are formed ground select gate pattern 130 and string select gate pattern 125, respectively. Cell source/drain regions 135c are formed in the semiconductor substrate 100 between adjacent cell gate patterns 120. A cell source/drain region 135ca and a common drain region 135d are formed on either side of the string select gate pattern 125. A cell source/drain region 135cb and a common source region 135s are formed in the semiconductor substrate 100 on either side of the ground select gate pattern 130. Each cell gate pattern 120 has the same structure as described above with respect to FIG. 28, and the string gate select pattern and ground select gate pattern 130 have the same structure as described above with respect to FIG. 29.

A source pattern 225a is formed on the common source region 135c, and the resulting structure is covered with a first interlayer insulating layer 150. According to one of the above described embodiments, a gettering region 265 having gettering cites 270 is formed in the first interlayer insulating layer over the cell source/drain regions 135ca and 135cb, respectively. Adjacent thereto, string contact plugs 137a and 137b are formed in the first interlayer insulating layer 150 to contact the cell source/drain regions 135ca and 135cd, respectively.

The resulting structure disposed between the string contact plugs 137a and 137b define a first NAND layer 301. A first upper semiconductor layer 200 is formed over the first NAND layer 301, and a second NAND layer 301' having the same structure as the first NAND layer 301 is formed using the first upper semiconductor layer 200 as a semiconductor substrate. To promote conduction between the layers, the first upper semiconductor layer 200 has contact doping regions 139a and 139b in contact with the string contact plugs 137a and 137b, respectively.

A third NAND layer 301" having the same structure as the second NAND layer 301', except for the string contact plugs 137a' and 137b' and gettering regions 265', is formed over the first NAND layer 301'. A bit line contact plug 235 is formed in the first, second and third interlayer insulating layers 150, 150' and 150" and in contact with the common drain region 135d. A bit line is formed over the third interlayer insulating layer 150" in contact with the bit line contact plug 235.

FIG. 30 illustrates a NAND memory device according to a third architecture, and will now be described. As shown, a plurality of cell gate patterns 120 are formed over a semiconductor substrate 100. A plurality of cell source/drain regions 135c are formed in the semiconductor substrate 100 between the cell gate patterns 120. Cell source/drain regions 135ca and 135cb are formed adjacent to the outermost cell gate patterns 120, respectively. A first interlayer insulating layer 150 is formed over the resulting structure. Contact plugs 137a and 137b are formed in the first interlayer insulating layer 150 in contact with the cell source/drain regions 135ca and 135cb, respectively. Also, gettering regions 265 having gettering sites 270 are formed according to any one of the above described embodiments in the first interlayer insulating layer 150. A first upper semiconductor layer 200b1 is formed over a portion of the first interlayer insulating layer 150 in contact with the contact plug 137a. A second upper semiconductor layer 200b2 is formed over a portion of the interlayer insulating layer 150 in contact with the contact plug 137b. A first ground select gate pattern 130a is formed over the second upper semiconductor layer 200b2, and is at least partially disposed over the gettering region 265. Similarly, a string select gate pattern 125a is formed over the first upper semiconductor layer 200b1, and is partially disposed over at least the other gettering region 265.

A second interlayer insulating layer 150' is formed over the resulting structure, and a first source pattern 225b is formed in the second interlayer insulating layer 150' in contact with a portion of the second upper semiconductor layer 200b2. An insulating layer 143 is formed over the resulting structure, and a bit line contact plug 235a is formed in the insulating layer 143 and the second interlayer insulating layer 150' in contact with the first upper semiconductor layer 200b1. A bit line 240 is formed over the resulting structure in contact with the bit line contact plug 235a.

Figure 31:
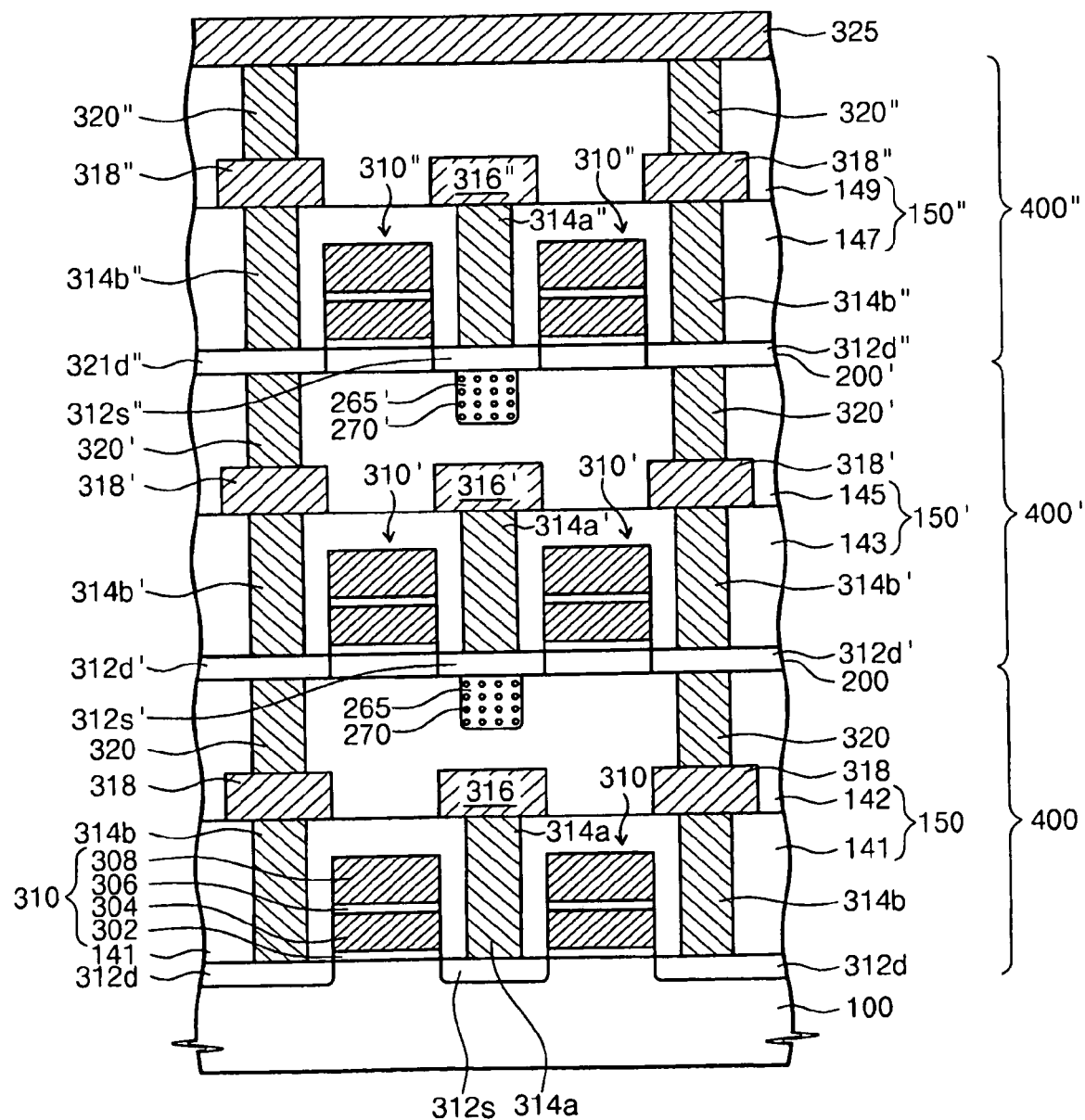
FIG. 31 illustrates application of the embodiment of FIG. 1 to a NOR memory device.

The present invention is not limited in application to NAND memory devices as the non-volatile memory device. For example, the embodiments of the present invention may also be applied to NOR memory devices. FIG. 31 illustrates application of the embodiment of FIG. 1 to a NOR memory device.

Referring to FIG. 31, a pair of cell gate patterns 310 are formed over the semiconductor substrate 100. Each cell gate pattern includes a tunnel oxide layer 302, a floating gate 304, an insulating layer 306, and a control gate 308. A cell source region 312s is formed in the semiconductor substrate 100 between the cell gate patterns 310. Cell drain regions 312d are formed in the semiconductor substrate 100 adjacent to the outer sides of the cell gate patterns 310. A first insulating layer 141 is formed over the resulting structure. A source plug 314a is formed in the first insulating layer 141 in contact with the cell source region 312s. Drain plugs 314b are also formed in the first insulating layer 141 in contact with the respective cell drain regions 312d. A cell source line pattern 316 is formed on the first insulating layer 141 in contact with the source plug 314. Buffer patterns 318 are formed on the first insulating layer 141 in respective contact with the drain plugs 314b. A second insulating layer 142 is formed over the resulting structure.

Together the first and second insulating layers 141 and 142 form the first interlayer insulating layer 150. Contact plugs 320 are formed in the second insulating layer 142 in respective contact with the buffer patterns 318. Also, a gettering region 265 having gettering sites 270 is formed in the second insulating layer 142 over the source line pattern 316. The gettering regions 265 having gettering sites 270 may be formed according to any one of the above described embodiments. The resulting structure forms a first NOR layer 400.

A second NOR layer 400' having the same structure as the first NOR layer may be formed over the first NOR layer 400. As stated, the second NOR layer 400' has the same structure as the first NOR layer 400 except that instead of a semiconductor substrate 100, the second NOR layer 400' includes an upper semiconductor layer 200 formed over the second insulating layer 142. Similarly, a third NOR layer 400" is formed over the second NOR layer 400'. The third NOR layer 400" has the same structure as the second NOR layer 400' except for not including a gettering region 265' having gettering sites 275'. A bit line 325 is formed over the third NOR layer 400".

It will be appreciated that the embodiments of the present invention may be applied to memory devices used in system applications. For example, FIG. 32 illustrates a system that includes a memory device to which an embodiment of the present invention has been applied.

Figure 32:
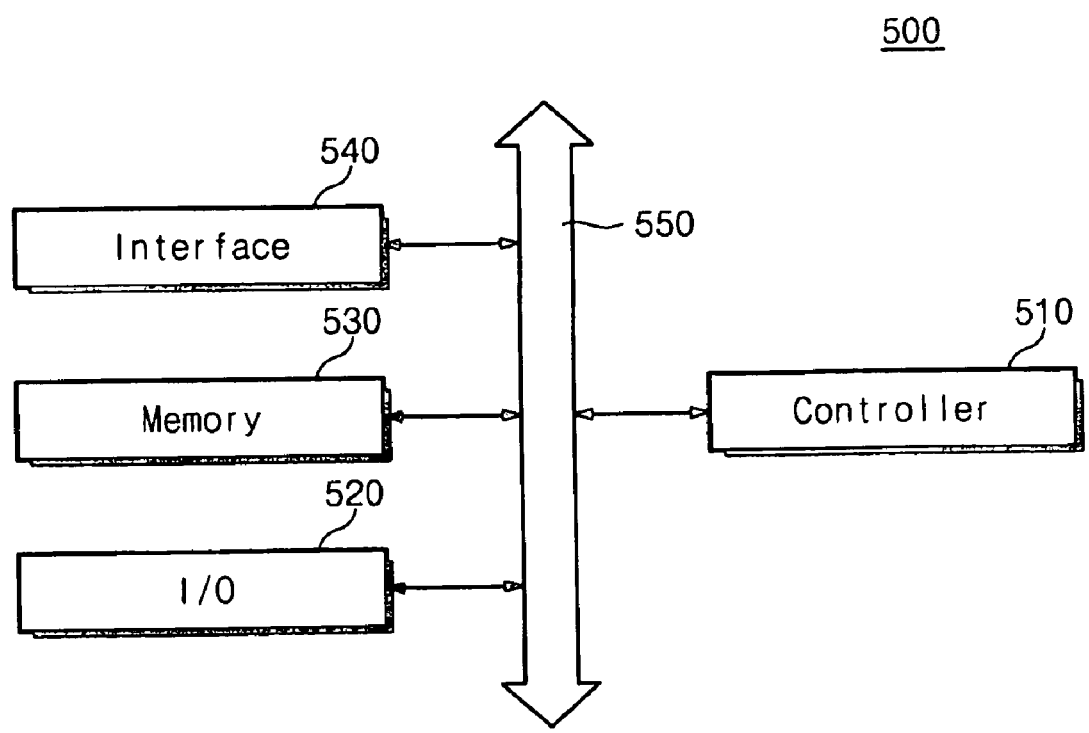
FIG. 32 illustrates a system that includes a memory device to which an embodiment of the present invention has been applied.

As shown in FIG. 32, a system 500 includes a controller 510, an input/output device 520, a memory 530, and an interface 540 connected to a bus 550. The system may be used in a mobile device such as a PDA, a portable computer, a web tablet, a wireless phone, a mobile phone, a digital music player, a memory card, or systems transmitting and/or receiving information. However, it will be understood that the system 500 is not limited to use in mobile devices.

The input/output device 520 may be a key pad, a keyboard, a display, and/or etc. The memory 530 may be used to store data and/or commands under the control of the controller 510. For example, the memory may be a flash memory such as a NAND type flash or a NOR type flash memory described above with respective to any one of FIGS. 28-31. The interface 520 may be any interface associated with the type of device including the system 500. For example, the interface 520 may provide for the transmission and reception of data into a communication network such as a wireless network.

The invention being thus described, it will be obvious that the same may be varied in many ways. Such variations are not to be regarded as a departure from the invention, and all such modifications are intended to be included within the scope of the invention.

We claim:

1. A method of forming a semiconductor structure, comprising:
    forming a first insulating layer over a semiconductor substrate;
    forming a gettering region in a portion of the first insulating layer;
    forming a semiconductor material over the first insulating layer;
    forming gettering sites in the semiconductor material; and
    forming semiconductor patterns exposing the first insulating layer by performing etch back on the semiconductor material.

2. The method of claim 1, further comprising
    forming a second insulating layer over the first insulating layer.

3. The method of claim 1, wherein the semiconductor material is at least one of amorphous silicon, single crystal silicon, poly crystal silicon, and poly crystal silicon having nano scale grains.

4. The method of claim 1, wherein the forming gettering sites is performed by ion implantation using at least one of H, He, Ar, Si, Ge, and Ne.

5. The method of claim 1, wherein the forming a gettering region is performed such that the gettering region extends completely through the first insulating layer.

6. The method of claim 5, wherein the forming a semiconductor material is performed by an epitaxial growing process.

7. The method of claim 1, wherein the forming a semiconductor material is performed by an epitaxial growing process.

8. The method of claim 1, wherein the forming a semiconductor material is performed by chemical vapor deposition.

9. The method of claim 8, wherein the CVD process is performed while supplying source gases that contain at least one of N, C, O, H, He, Ar, Si, Ge, and Ne such that the gettering sites are creates in the semiconductor material.

10. The method of claim 1, wherein the etch back process is chemical mechanical polishing.

11. A method of forming a semiconductor structure, comprising:
    forming a gettering region layer over a first semiconductor substrate;
    patterning the first semiconductor substrate and the gettering region layer to form at least one semiconductor substrate projection having a gettering region formed there over;
    positioning the first semiconductor substrate near a second semiconductor substrate such that the semiconductor substrate projection projects towards a first insulation layer on the second semiconductor substrate;
    forming a first semiconductor layer over the first insulating layer such that the first semiconductor layer covers the gettering region; and
    removing the first semiconductor substrate such that at least the gettering region remains in the first semiconductor layer.

12. A method of forming a semiconductor structure, comprising:
    positioning a first semiconductor substrate near a second semiconductor substrate, the second semiconductor substrate having a first insulating layer formed there over and at least one gettering region formed in the first insulating layer, the first semiconductor substrate having projections, and the first semiconductor substrate being positioned such that the projections project towards the first insulating layer;
    forming a first semiconductor layer over the first insulating layer such that the first semiconductor layer covers a portion of the projections; and
    removing the first semiconductor substrate such that at least portions of the projections covered by the first semiconductor layer remain in the first semiconductor layer.

13. A method of forming a semiconductor structure, comprising:
    providing a semiconductor substrate having a first insulating layer formed there over and at least one gettering region formed in the first insulating layer; and
    coating a carrier solution having a solvent and semiconductor crystal patterns over the first insulating layer;
    removing the solvent to leave the semiconductor crystal patterns; and
    growing a semiconductor layer on the first insulating layer using the semiconductor crystal patterns as a seed layer.

14. A method of forming a semiconductor structure, comprising:
    providing a semiconductor substrate having a first insulating layer formed there over and at least one gettering region formed in the first insulating layer; and
    forming at least one semiconductor plug in the first insulation layer; and
    growing a semiconductor layer on the first insulating layer using the semiconductor plug as a seed layer.

* * * * *